United States Patent [19]

Takemura et al.

[11] 3,902,077

[45] Aug. 26, 1975

[54] VARIABLE ATTENUATING CIRCUIT

[75] Inventors: Takehide Takemura; Shunzo Oka, both of Hirakata, Japan

[73] Assignee: Matsushita Electric Industrial Co., Ltd., Kadoma, Japan

[22] Filed: June 18, 1974

[21] Appl. No.: 480,386

[30] Foreign Application Priority Data

June 21, 1973 Japan .............................. 48-70190

[52] U.S. Cl. ............... 307/237; 330/30 D; 330/144

[51] Int. Cl.[2] ........................ H03F 3/45; H03G 3/10

[58] Field of Search .......... 307/237; 330/30 D, 144; 333/17 M, 81

[56] References Cited

UNITED STATES PATENTS

| | | | |
|---|---|---|---|
| 3,562,660 | 2/1971 | Pease | 330/30 D |
| 3,689,752 | 9/1972 | Gilbert | 330/30 D |
| 3,717,821 | 2/1973 | Amemiya et al. | 330/30 D |

*Primary Examiner*—John Kominski
*Attorney, Agent, or Firm*—Stevens, Davis, Miller & Mosher

[57] ABSTRACT

A variable attenuating circuit comprising a differential section including a first transistor and a second transistor parallel with each other, a constant-current circuit connected in cascade to the differential section. The base voltage on one of the transistors in the differential section is controlled, so that with an input signal coupled to an input terminal connected to the constant-current circuit an attenuated output signal can be obtained from the collector of the other transistor of the differential section. Since no frictional part is present in the signal path, no frictional noise is provided and also long service life is ensured.

5 Claims, 3 Drawing Figures

VARIABLE ATTENUATING CIRCUIT

This invention relates to a variable attenuating circuit free from any frictional part and hence any noise stemming therefrom and also to a control means for controlling such a variable attenuating circuit or commonly controlling a plurality of such variable attenuating circuits.

Variable attenuators for attenuating input signal have heretofore employed variable resistors. Such variable attenuator, however, has been prone to the generation of frictional noise due to the presence of the frictional part in the signal path. Also, the mechanical service life of the variable resistor is short.

This invention is predicated in the provision of a variable attenuating circuit, which is free from any frictional part present in the signal path and permits to eliminate the afore-mentioned drawback inherent in the prior art.

The primary object of the invention is to permit control of the attenuating degree of a variable attenuating circuit by varying a d-c control voltage.

The above and other objects, features and advantages of the invention will become more apparent from following description taken in connection with the accompanying drawings, in which.

An embodiment of the variable attenuating circuit according to the invention will now be described with reference to FIGS. 1 and 2.

Figure 1:
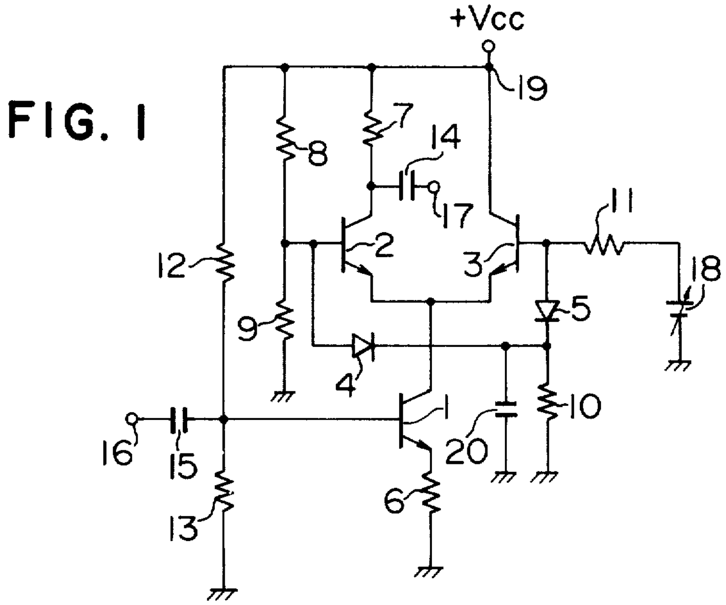
FIG. 1 is a circuit diagram showing an embodiment of the variable attenuating circuit according to the invention.

In FIG. 1, a transistor 1 constituted a constant-current circuit, the collector current flowing in it being substantially equal to the base voltage determined by the voltage division ratio of a voltage divider of resistors 12 and 13 divided by the resistance of a resistor 6. Transistors 2 and 3 constitute a differential section. When a d-c control voltage 18 coupled through a resistor 11 to the base of the transistor 3 is zero, a diode 4 carries several milliamperes of current determined by resistors 8, 9 and 10 and the source voltage to provide a certain voltage drop $V_B$ across the resistor 10. Meanwhile, with zero control voltage a diode 5 is reversely biased by the afore-mentioned voltage $V_B$ so that is "off." In this case, the base voltage on the transistor 3 is zero, and the collector voltage thereon is substantially equal to the base voltage on the transistor 2, that is, the afore-mentioned voltage $V_B$ if the small voltage drop across the diode 4 is ignored. Hence, the transistor 3 is reversely biased and is "off." On the other hand, the transistor 2 has its base forwardly biased, and hence it is "on," carrying the same current as that flowing in the transistor 1. If an a-c signal prevails at an input terminal 16, an a-c current equal to the input voltage divided by the resistance of the resistor 6 flows as collector current through the transistor 1. In the "off" state of the transistor 3, this whole current flows through the transistor 2. Thus, if the resistance of a resistor 7 on the collector side of the transistor 2 is made equal to that of the resistor 6, an a-c output equal to the input is obtained from the collector of the transistor 2.

When the control voltage 18 slightly exceeds the afore-mentioned voltage $V_B$, the diode 5 is rendered "on." As a result, the current through the diode 4 is increased by an amount corresponding to an increase of the voltage $V_B$ across the common resistor 10 due to the current caused to pass through the diode 5. At this time, the transistor 3 is triggered, so that the current through the transistor 1 is shared between the transistors 2 and 3.

Figures 2, 3:
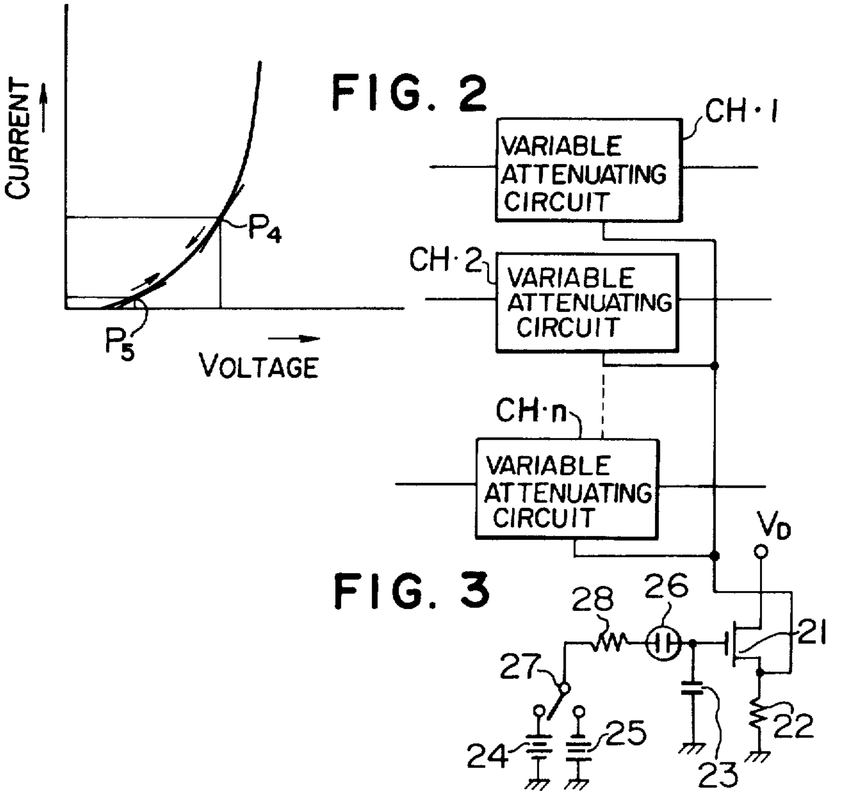
FIG. 2 shows a characteristic of diodes used in the circuit of FIG. 1.
FIG. 3 is a circuit diagram, partly in block form, showing a second embodiment of the invention, in which a plurality of variable attenuating circuits are controlled by a charge preservation circuit.

The diodes 4 and 5 have a characteristic as shown in FIG. 2, with the working points of the diodes 4 and 5 indicated respectively at $P_4$ and $P_5$. At this time, the a-c current through the transistor 1 is shared between the transistors 2 and 3, and an output determined by the ratio between the slopes at points $P_4$ and $P_5$ and smaller than that in case when the control voltage 18 is zero appears at an output terminal 17. With increase of the control voltage 18, the working points of the diodes 4 and 5 as shown in FIG. 2 are shifted in directions as indicated by arrows, and at an instant when both the working points coincide the output is attenuated to be substantially one half that when the control voltage 18 is zero. With further increase of the control voltage 18, the slope for the diode 5 becomes greater than that for the diode 4, so that the output is further attenuated until the voltage $V_B$ across the resistor 10 ultimately exceeds the voltage provided by the voltage divider of resistors 8 and 9, whereupon the transistor 2 is cut off. At this time, the output is reduced to zero corresponding to maximum attenuation. In the above way, the attenuation degree can be freely adjusted by varying the d-c control voltage 18.

With the circuit of FIG. 1, by setting the source voltage $V_{cc}$ to 12 volts and the base voltage on the transistor 1 to 1.5 volts it is possible to achieve a heretofore unavailable high performance with maximum permissible input of 1 volt rms, attenuation of 0 to −70 dB and distortion factor of no greater than 1 percent.

In the above embodiment, NPN transistors are used for the transistors 1, 2 and 3 since the bias source voltage $V_{cc}$ is positive. In case when the bias source voltage is negative, entirely the same operation and effects may be obtained by using PNP transistors and reversing the polarity of the diodes 4 and 5.

In the above variable attenuating circuit, the variable d-c control voltage 18 is inserted to facilitate the description. Actually, however, the circuit construction of the variable attenuating circuit does not include the control voltage 18.

FIG. 3 shows another embodiment of the invention, in which a charge preservation circuit is provided to control a plurality of variable attenuating circuits of the afore-mentioned construction.

Referring to the Figure, there are shown a plurality of variable attenuating circuits $CH_1$, $CH_2$ . . . $CH_n$, which have the construction of the above embodiment. These variable attenuating circuits $CH_1$, $CH_2$ . . . $CH_n$ have their control terminals (corresponding to what is connected to the control voltage 18 in FIG. 1) connected in common, and the common connection is connected to the source of a MOS field-effect transistor 21 (hereinafter referred to as MOS transistor). An adequate d-c voltage $V_D$ is applied to the drain of the MOS transistor 21, and between the source thereof and earth an output resistor 22 is connected. Between the gate of the MOS transistor 21 and earth a capacitor 23 is connected. The gate of the MOS transistor 21 is also connected to a neon discharge tube 26, which is in turn connected through a resistor 28 to a switch 27 for switching positive and negative voltage sources 24 and 25 whose voltage is higher than the discharging voltage of the neon discharge tube 26.

When the switch 24 is thrown to the positive voltage source 24, the discharge of the neon discharge tube 26 is caused to charge the capacitor 23 through the input resistor 28. Thus, an output voltage proportional to the terminal voltage across the capacitor appears at the source of the MOS transistor 21. When the switch 27 is subsequently switched to the "off" or neutral position, the neon discharge tube 26 is turned "off." In this state, the terminal voltage across the capacitor 23, and hence the proportional output voltage prevailing at the source of the MOS transistor 21, is preserved. When the switch 27 is subsequently thrown to the negative voltage source 25, the discharge of the neon discharge tube 26 is caused again but in the opposite direction, so that the capacitor 23 is discharged. As a result, the output voltage is reduced. By subsequently switching off the switch 27 again, the output voltage of a certain value prevailing at the source of the MOS transistor is similarly preserved.

In the above way, by appropriately operating the switch 27 a desired output voltage may be obtained from the source of the MOS transistor 21, and that voltage may be preserved by rendering the switch "off." By varying the output voltage appearing at the source of the MOS transistor 21 in this manner the attenuation degree of the individual variable attenuating circuits $CH_1$, $CH_2$ . . . $CH_n$ may be controlled.

While the preceding embodiment has concerned with the case of commonly controlling a plurality of variable attenuating circuits, the same principles may of course be applied to the control of a single variable attenuator as well. Also, the neon discharge tube in FIG. 3 may be replaced with other switching elements such as lead relays.

With the above construction of the variable attenuator control according to the invention, the attenuation degree of either a single attenuator or a plurality of attenuators may be controlled by merely connecting the switch to the positive or negative d-c voltage source or switching it off. Since the variable attenuating circuit is free from any frictional part such as variable resistor provided in the signal path, no frictional noise will be generated. Also, since no mechanical part is involved, long service life can be ensured. Further, since it is possible to provide for maximum permissible input of several volts and achieve low distortion factor, the field of application can be extended to a variety of circuits. Furthermore, since the switch is electronically operated, remote control is facilitated, and when applied to acoustical systems such as stereo systems it is possible to provide a remote volume control totally free from frictional part.

What we claim is:

1. A variable attenuating a circuit comprising a differential section including a first transistor and a second transistor parallel with each other, a constant bias voltage being applied to the base of said first transistor, a constant-current circuit consisting of a third transistor whose collector being connected to the emitters of said first and second transistors in said differential section, and diodes individually connected in forward polarity between the respective bases of said first and second transistors and a grounded common resistor, an input signal being coupled to the base of said third transistor, the base bias voltage on said second transistor being controlled to obtain an attenuated output signal from an output terminal connected to said first transistor.

2. A variable attenuating circuit according to claim 1, which further comprises a variable d-c voltage source connected between the base of said second transistor and earth.

3. A variable attenuating circuit comprising a differential section including a first transistor and a second transistor parallel with each other, a constant bias voltage being applied to the base of said first transistor, a third transistor constituting a constant-current circuit and connected in cascade to the output side of said differential section, diodes individually connected in forward polarity between the respective bases of said first and second transistors and a grounded common resistor, a MOS field-effect transistor having the drain held at a constant d-c voltage and the source connected to the base of said second transistor, a resistor connected between the source of said MOS field-effect transistor and earth, a capacitor connected between the gate of said MOS field-effect transistor and earth, a series circuit consisting of an input resistor and a switching element, said series circuit being connected to the gate of said MOS field-effect transistor, and positive and negative d-c voltage sources for controlling the charging and discharging of said capacitor through said series circuit.

4. The variable attenuating circuit according to claim 3, wherein said switching element consists of a neon tube.

5. a variable attenuating circuit comprising a plurality of variable attenuating means each comprising a differential section including a first transistor and a second transistor parallel with each other, a constant bias voltage being applied to the base of said first transistor, a constant-current circuit consisting of a third transistor and connected in cascade to the output side of said differential section, and diodes individually connected in forward polarity between the respective bases of said first and second transistors and a grounded common resistor, a MOS field-effect transistor having the drain held at a constant d-c voltage and the source connected to the base of said second transistor of each said variable attenuating means, a resistor connected between the source of said MOS field-effect transistor and earth, a capacitor connected between the gate of said MOS field-effect transistor and earth, a series circuit consisting of an input resistor and a switching element, said series circuit being connected to the gate of said MOS field-effect transistor, and positive and negative d-c voltage sources for controlling the charging and discharging of said capacitor through said series circuit.

* * * * *